United States Patent
Malone et al.

(10) Patent No.: US 7,145,780 B2
(45) Date of Patent: Dec. 5, 2006

(54) PRINTED CIRCUIT BOARD ENGAGEMENT APPARATUS USING FOUR-BAR LINKAGE

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

(21) Appl. No.: 10/835,962

(22) Filed: Apr. 29, 2004

(65) Prior Publication Data
US 2005/0243533 A1 Nov. 3, 2005

(51) Int. Cl.
*H05K 5/00* (2006.01)
*H01R 13/62* (2006.01)

(52) U.S. Cl. .................... 361/752; 439/368
(58) Field of Classification Search ............. 361/788, 361/801, 732, 736, 740, 747, 748, 798; 439/686, 439/160
See application file for complete search history.

(56) References Cited

U.S. PATENT DOCUMENTS

| | | | |
|---|---|---|---|
| 4,002,386 A | * | 1/1977 | McKenzie ............. 312/332.1 |
| 5,644,470 A | * | 7/1997 | Benedict et al. ........... 361/686 |
| 5,657,204 A | * | 8/1997 | Hunt ........................... 361/752 |
| 5,687,061 A | * | 11/1997 | Mesfin et al. .............. 361/686 |
| 5,743,503 A | | 4/1998 | Voeller et al. |
| 5,765,797 A | | 6/1998 | Greene et al. |
| 5,990,981 A | * | 11/1999 | Thompson et al. ......... 348/705 |
| 6,015,308 A | * | 1/2000 | Lee et al. .................... 439/155 |
| 6,094,358 A | * | 7/2000 | Christensen et al. ....... 361/785 |
| 6,128,196 A | * | 10/2000 | Hoyle et al. ................ 361/752 |
| 6,603,655 B1 | | 8/2003 | Hrehor, Jr. et al. |
| 6,623,098 B1 | | 9/2003 | Davis |
| 6,884,096 B1 | * | 4/2005 | Centola et al. ............. 439/157 |

* cited by examiner

*Primary Examiner*—Kamand Cuneo
*Assistant Examiner*—Hung Nguyen

(57) ABSTRACT

A printed circuit board connector engagement apparatus includes a four-bar linkage capable of coupling to an electronics system housing and is configured to accept and enable a printed circuit board to travel in a first direction until a connector on the printed circuit board and a corresponding connector coupled to the housing are aligned. The four-bar linkage further enables the printed circuit board to travel essentially orthogonal to the first direction to engage the printed circuit board and housing connectors.

29 Claims, 6 Drawing Sheets

PRINTED CIRCUIT BOARD ENGAGEMENT APPARATUS USING FOUR-BAR LINKAGE

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. An electronic system housing commonly has a backplane or midplane with multiple connectors that are adapted for mating with electronic devices and subsystems, such as printed circuit boards or cards. In turn, the electronic devices and subsystems perform various functions and applications.

A common goal in electronic system design is compaction or reduction in size that enables increased performance and functionality in a smaller physical space. One aspect of a compact design is a capability to insert and remove internal components and devices from tightly-packed spaces.

SUMMARY

In accordance with an embodiment of a printed circuit board connector engagement apparatus, a four-bar linkage capable of coupling to an electronics system housing is configured to accept and enable a printed circuit board to travel in a first direction until a connector on the printed circuit board and a corresponding connector coupled to the housing are aligned. The four-bar linkage further enables the printed circuit board to travel essentially orthogonal to the first direction to engage the printed circuit board and housing connectors.

BRIEF DESCRIPTION OF THE DRAWINGS

Embodiments of the invention relating to both structure and method of operation, may best be understood by referring to the following description and accompanying drawings.

DETAILED DESCRIPTION

Figure 1:
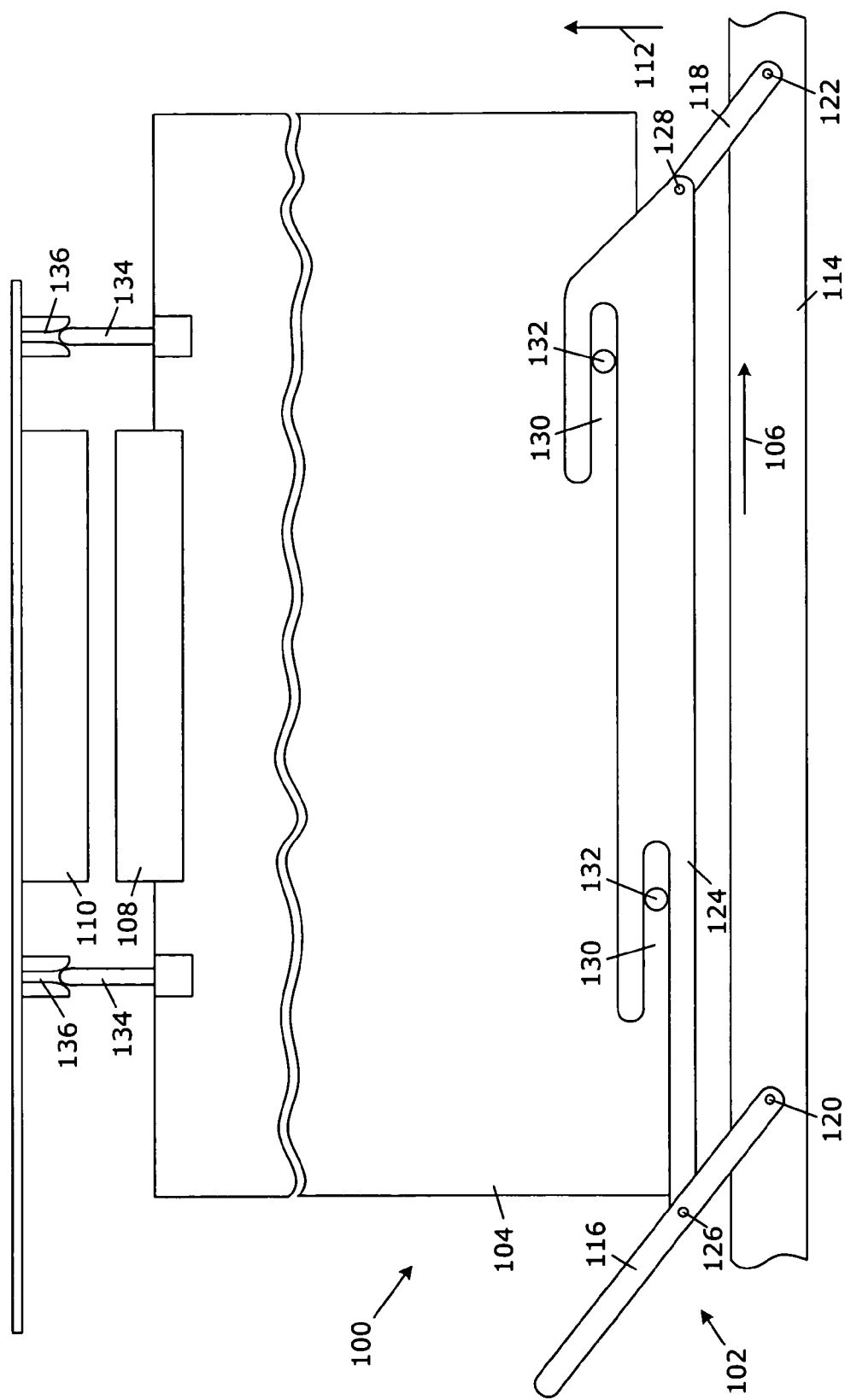
FIG. 1 is a pictorial drawing illustrating an embodiment of a printed circuit board connector engagement apparatus including a four-bar linkage.

Referring to FIG. 1, a pictorial drawing illustrates an embodiment of a printed circuit board connector engagement apparatus 100 including a four-bar linkage 102 capable of coupling to an electronics system housing. The four-bar linkage 102 is configured to accept and enable a printed circuit board 104 to travel in a first direction 106 until a connector 108 on the printed circuit board 104 and a corresponding backplane or midplane connector or socket 110 coupled to the housing are aligned. The four-bar linkage 102 further enables the printed circuit board 104 to travel essentially orthogonal 112 to the first direction to engage the connector 108 with the socket 110.

By definition, a four-bar linkage assembly has four axes of rotation connected by four rigid linkages.

In a particular example, the four-bar linkage 102 further includes a base link 114 that can be firmly affixed to the housing and forms a stationary link of the four-bar linkage 102. The four-bar linkage 102 also includes first 116 and second 118 rotating links, each of which is pivotally coupled to the base link 114 at pivots or hinges 120 and 122, respectively, and form movable levers of the four-bar linkage 102. At least one of the levers 116, 118 is accessible for manipulation and rotation to engage and disengage the connector 108 from the socket 110. The four-bar linkage 102 also has a coupler link 124 that is pivotally coupled to the first 116 and second 118 rotating links at pivots or hinges 126 and 128 and functions as a board guide for the printed circuit board 104.

The illustrative four-bar linkage 102 has slots 130 formed in the coupler link 124 configured to engage with pins and/or rollers 132 on the printed circuit board 104. The pins or rollers 132 transfer forces from the four-bar linkage 102 to the connector 108 The four-bar linkage 102 is configured so that rotation of an accessible lever, for example rotating link 116, translates the printed circuit board 104 in the first direction 106 and the orthogonal direction 112 so that pins 134 coupled to the printed circuit board 104 engage with corresponding apertures 136 in the housing, preventing further translation in the first direction 106, aligning the connector 108 and socket 110, and causing additional rotation of the accessible lever 116 to result in orthogonal motion alone to fully engage the connector 108.

The slots 130 have sufficient length to enable the printed circuit board 104 to be located in approximate alignment with the housing connector or socket 110.

In various embodiments, a four-bar linkage can be configured to engage a single connector to a single socket or multiple connectors on the printed circuit board to multiple sockets in the housing.

Figure 2A:
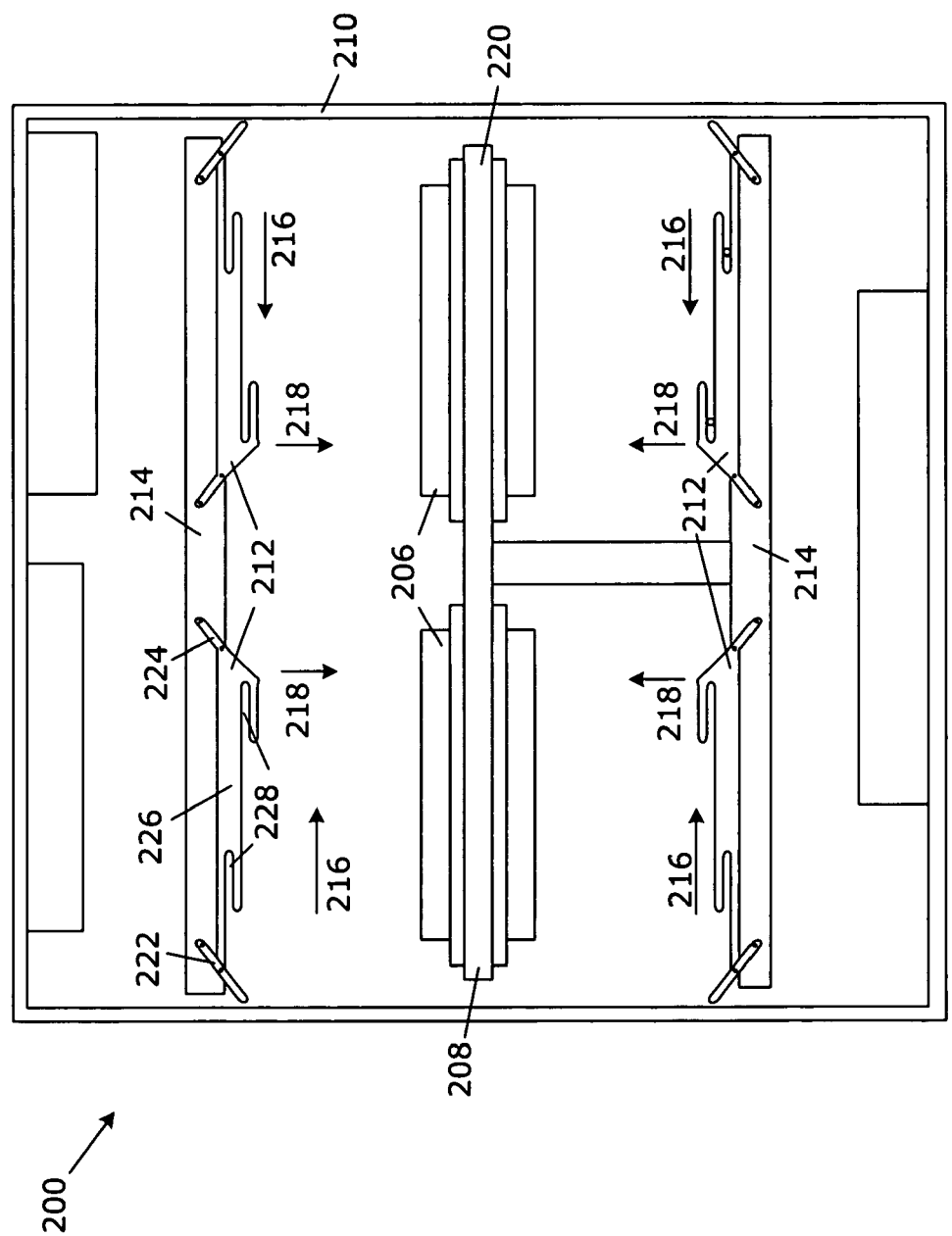
FIGS. 2A and 2B are schematic pictorial diagrams showing respective unloaded and loaded side views of an electronic system that includes four-bar linkage connectors for engaging and disengaging printed circuit boards.
Figure 2B:
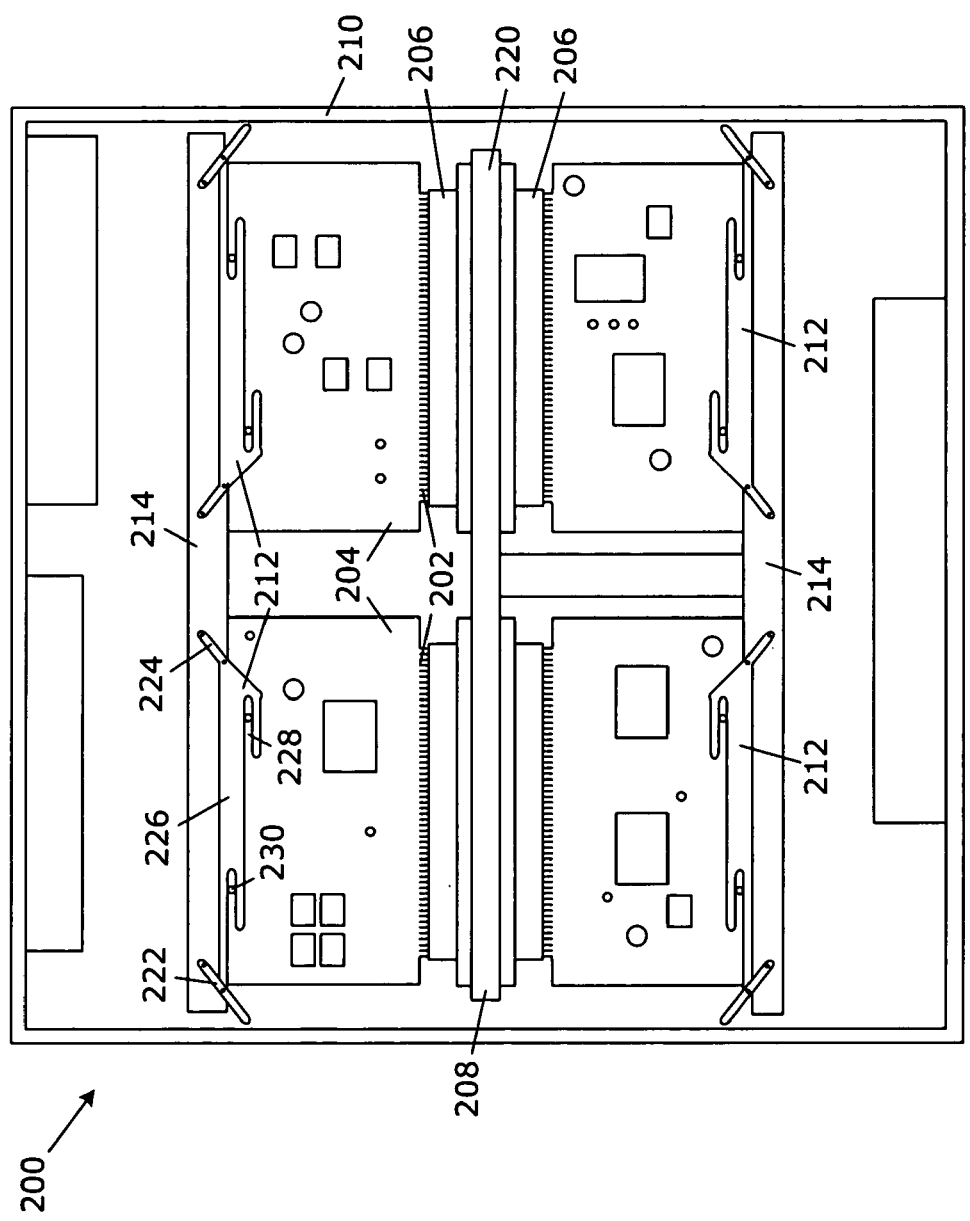

Referring to FIGS. 2A and 2B, schematic pictorial diagrams illustrate side views of an electronic system 200 that includes four-bar linkage connectors 202 for engaging and disengaging printed circuit boards 204. FIG. 2A illustrates a side view of the system 200 with four-bar linkage connectors 202. FIG. 2B shows the system 200 with four-bar linkage connectors 202 populated with printed circuit boards 204. The connector apparatus 202 includes a backplane or midplane socket 206 capable of coupling to a first surface 208 of an electronic system housing 210; and a four-bar linkage 212. The four-bar linkage 212 can be coupled to a second surface 214 of the electronic system housing 210 that is substantially parallel with and opposing the first surface 208. The four-bar linkage 212 is configured to accept and enable a printed circuit board 204 to travel in a first direction 216 until a connector 202 on the printed circuit board 204 and the socket 206 are aligned, then enables the printed circuit board 204 to travel essentially orthogonal 218 to the first direction 216 to engage the connector 202 with the socket 206.

In the illustrative embodiment, the housing 210 is configured to accept a plurality of printed circuit boards 204 in a vertical layout so that vertical printed circuit boards 204 connect to a horizontal backplane or midplane 220 coupled to the housing 210 with printed circuit boards 204 loaded into the housing 210 from the front and/or rear of the housing 210.

FIG. 2B depicts a system with multiple printed circuit boards 204 each configured with one or more connectors 202 that are capable of engagement by the socket 206. The illustrative electronic system 200 has a backplane or midplane 220 configured to extend in a horizontal plane in a generally central portion of the housing 210. The illustrative backplane or midplane 220 has multiple sockets 206 on both upper and lower planar surfaces and the housing 210 has reception areas both above and below the generally central midplane or backplane 220 so that printed circuit boards 204 may be received on both lower and upper surfaces of the midplane or backplane 220. The electronic system 200 shown in FIGS. 2A and 2B has sockets 206 positioned to receive printed circuit boards 204 in both the front and rear portions of the housing 210 so that multiple printed circuit boards 204 can be connected to the midplane or backplane 220 in multiple side-by-side columns and forward and rear rows. The electronic system 200 has sockets 206 connected on both top and bottom sides of the horizontal midplane or backplane 220 so that the columns and rows of printed circuit boards 204 can be inserted both above and below the midplane or backplane 220. Other configurations may accept more rows of printed circuit boards or accept only a single row. Some configurations may accept printed circuit boards on only a single side of the backplane.

The second surface 214 of the housing 210 forms a base or stationary link of the four-bar linkage 212. The four-bar linkage 212 further includes rotating links 222 and 224 that are pivotally coupled to the base link 214 and function as movable levers for manipulation and rotation, enabling engagement and disengagement of the printed circuit board connectors 202 from the sockets 206. A coupler link 226 is also pivotally coupled to the rotating links 222, 224 to complete the four-bar linkage 212 and operate as a printed circuit board guide. The four-bar linkage 212 is constructed to accommodate a printed circuit board 204, for example using slots 228 formed in the coupled link 226 in a geometry and position that enable engagement with pins and/or rollers 230 on a printed circuit board 202 that is configured for acceptance by the four-bar linkage 212.

The four-bar linkage 212 has a form that enables functionality in facilitating engagement and disengagement of a printed circuit board 204 from a socket 206. The rotating links 222, 224 include at least one lever that is accessible for manipulation. On rotation of the accessible lever, the printed circuit board is translated in a first direction 216, in the illustrative embodiment in a horizontal direction into the housing 210, and also in a direction 218 orthogonal to the first direction. Structures in the printed circuit boards 204, for example guide pins, can be used to arrest the horizontal movement of the printed circuit board so that additional rotation of the lever causes the orthogonal, or vertical, motion alone to fully engage the connector 202 with the socket 206. In various embodiments, the printed circuit boards may have single connectors or multiple connectors, and similarly single or multiple sockets may be configured to accept the connector or connectors.

Figure 3:
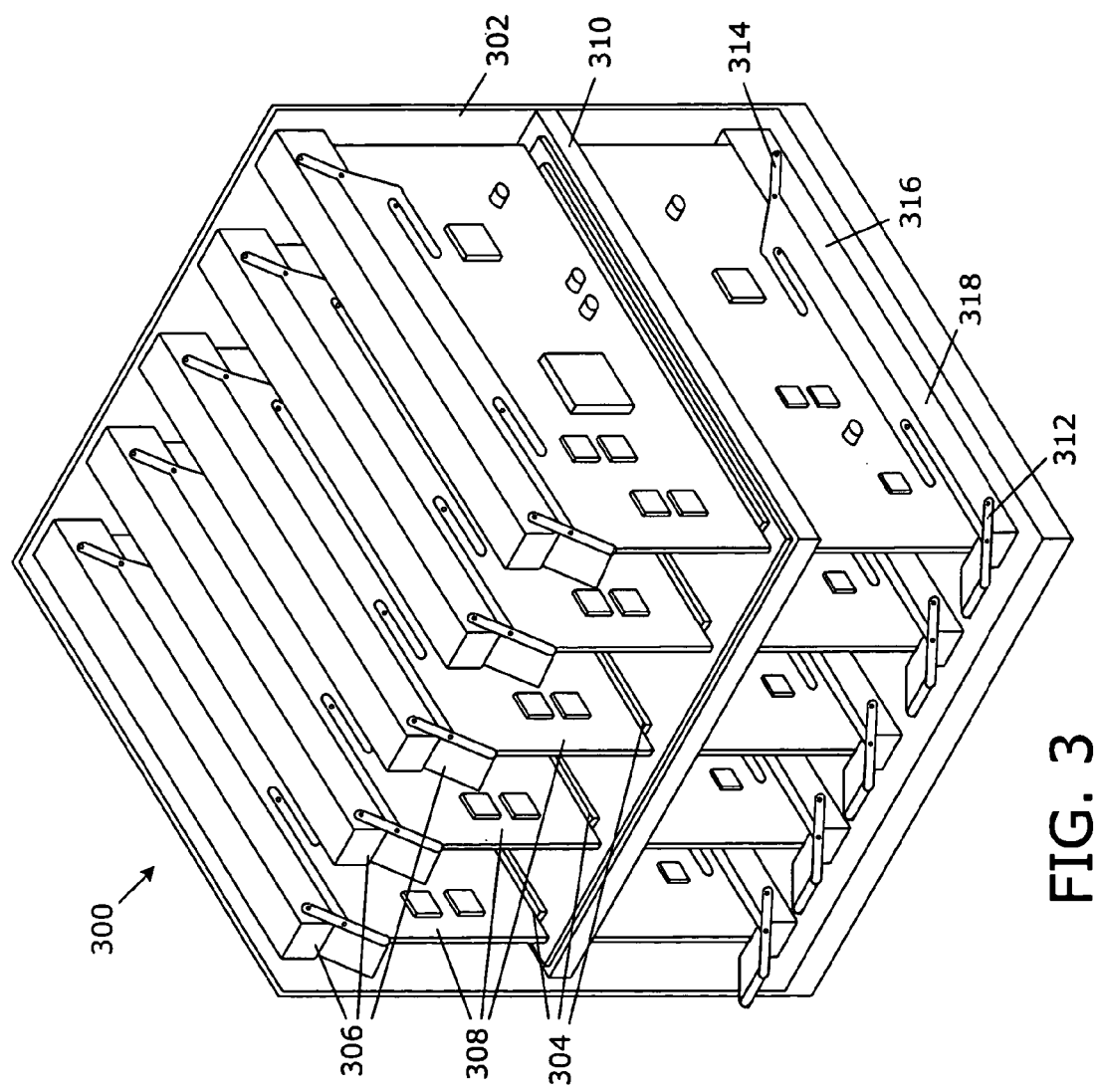
FIG. 3 is a cut-away perspective pictorial diagram depicting an embodiment of an electronic system that uses a four-bar linkage for printed circuit board engagement and disengagement.

Referring to FIG. 3, a cut-away perspective pictorial diagram illustrates an embodiment of an electronic system 300 that uses a four-bar linkage for printed circuit board engagement and disengagement. The electronic system 300 includes a housing 302, at least one midplane or backplane socket 304 coupled to a surface of the housing 302, and at least one four-bar linkage 306. The four-bar linkages 306 are coupled to a surface substantially parallel and opposing the socket surface. The four-bar linkages 306 are configured to accept and enable a printed circuit board 308 to travel in a first direction until a connector on the printed circuit board 308 and the socket 304 are aligned, then enable the printed circuit board 308 to travel essentially orthogonal to the first direction to engage the connector with the socket 304.

The four-bar linkage 306 can be implemented in a wide variety of electronic systems including servers, computer systems, computers, storage systems, communication systems, application processing systems and the like.

In the illustrative electronic system 300, vertically-arranged printed circuit boards 306, for example cell boards, can be inserted to make electrical connection to a horizontal midplane or backplane 310. The printed circuit boards 306 load into the chassis or housing 302 from the front and/or rear. One aspect that enables the unique vertical cell board layout and a dense system architecture is a connector engagement and disengagement apparatus that enables the cards to move horizontally until connectors on the printed circuit boards 306 and the midplane or backplane 310 are aligned, and then vertically to engage the connector pins and sockets 304. The connector engagement and disengagement apparatus 306 also enables the connectors to be disengaged and supplies sufficient mechanical characteristics that the engagement and disengagement operations can be performed with an appropriate applied force, typically in a range from 5 to 10 lbs.

The four-bar linkage 306 is formed by attaching two links 312, 314 to a member 316 connected to the server chassis 302 and joining the two links 312, 314 with a third coupler link 318. One of the links 312 fixed to the chassis 302 functions as a lever which is rotated to engage or disengage the connector. The coupler link 318 functions as a card guide for guiding the edge of the cell board 308. When a cell board 308 is loaded into the system 300, pins or rollers located on the board 308 engage with slots on the coupler link 318. Rotation of the lever 312 causes the cell board 308 and four-bar linkage 306 to translate vertically and horizontally. As the assembly moves, pins mounted on the top of the cell board 308 engage with holes on the horizontal midplane or backplane 310, preventing further horizontal translation of the cell board 308 and supplying precision alignment between the connectors on the cell board 308 and horizontal midplane or backplane 310. Further rotation of the lever 312 causes pure vertical motion of the cell board 308 to fully engage the connectors. Horizontal motion of the cell board 308 is greatly reduced or eliminated because the pins or rollers on the cell board 308 are not constrained horizontally by the slots on the coupler link 318. Force from the lever 312 is transmitted to the connector through pin-slot line contact.

Figure 4:
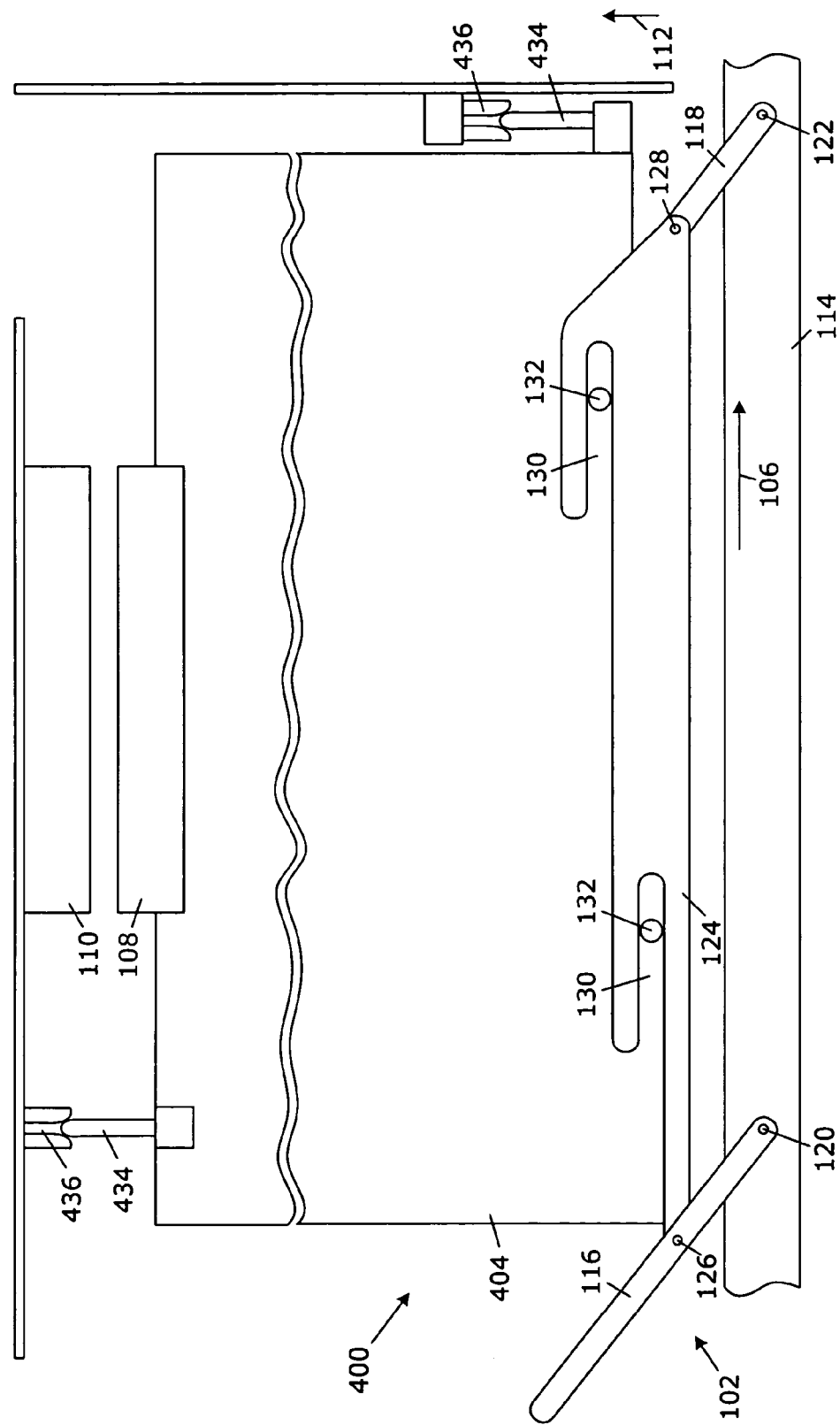
FIG. 4 is a pictorial drawing illustrating an alternative embodiment of a printed circuit board connector engagement apparatus including a four-bar linkage.

Referring again to FIG. 1, the pins 134 on the cell board 104 may be located at the same elevation if attached on opposite sides of the board 104, as shown. Alternatively, if pins are loaded on the same side of the printed circuit board, the pins are typically positioned at different vertical elevations. In another embodiment 400, shown in FIG. 4, the pins 434 may be located on a diagonal line across the cell board 404 for better vertical alignment. Locating the pins 434 at different elevations enables improved vertical positioning of the card 404.

Figure 5:
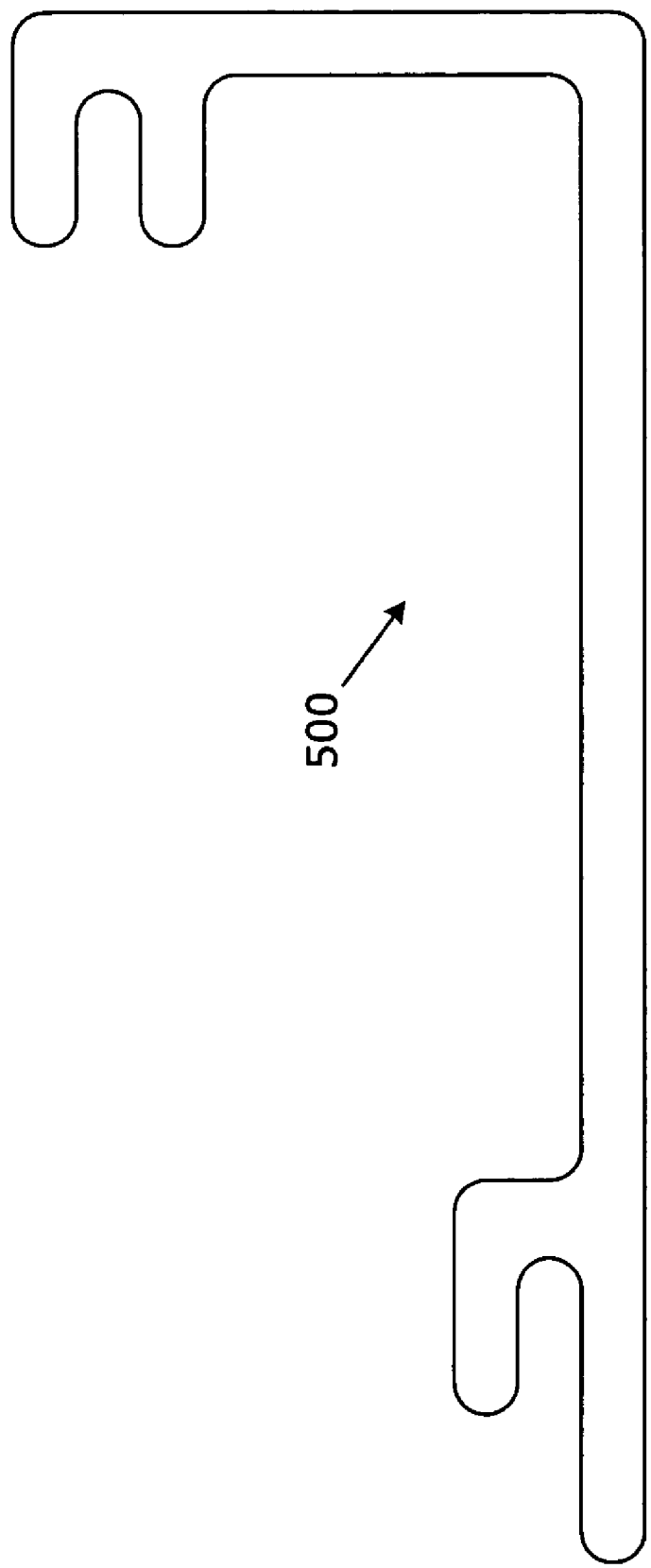
FIG. 5 is a pictorial drawing that shows an embodiment of an alternative coupling link for a four-bar linkage.

In other embodiments, the coupler link may be formed into other various shapes, such as the L-shaped coupler link 500 shown in FIG. 5, to accommodate pin positions on the cell boards.

In various embodiments, the coupler link 124, 226, 318 can support printed circuit boards, cell cards, and the like by adding strength to prevent bowing during connector engagement and disengagement. The coupler shape may be optimized to improve strength without impacting the primary engagement and disengagement functionality and performance of the four-bar link. The four-bar linkage links are commonly fabricated from sheet metal or heavy duty plastic for a low cost. The four-bar linkage assembly can be manufactured and installed with standard sheet metal and plastic part tolerance to reduce fabrication cost since precision alignment is attained with low-cost pins and/or rollers, and alignment hole blocks.

The four-bar linkage may be used not only for vertical connector engagement, but also for engagement of printed circuit boards and cell cards in any appropriate orientation.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular configurations of four-bar linkage systems are shown, any suitable physical arrangement that accomplishes the specified functions can be used. Similarly, physical characteristics of the system within which the four-bar linkages can be implemented may have any suitable form. Although the illustrative embodiments show usage of the four-bar linkages to connect to a horizontal backplane, any appropriate disposition may be implemented including a horizontally mounted midplane or backplane or a disposition at any angle between horizontal and vertical. Also, particular electronic system embodiments are illustrated, for example a computer server. In other embodiments, the four-bar linkage can be employed in other types of electronic systems such as communication systems, storage systems, entertainment systems, and the like.

What is claimed is:

1. A printed circuit board connector engagement apparatus comprising:
   a four-bar linkage coupled to an electronics system housing whereby a surface of the housing is configured as a stationary link of the four-bar linkage, the four-bar linkage being configured to accept and enable a printed circuit board to travel in a first direction until a connector on the printed circuit board and a corresponding connector coupled to the housing are aligned, then enabling the printed circuit board to travel essentially orthogonal to the first direction to engage the printed circuit board and housing connectors.

2. The apparatus according to claim 1 further comprising:
   a base link comprising the housing surface and forming the stationary link of the four-bar linkage that is fixed in position relative to the housing;
   first and second rotating links, each pivotally coupled to the base link and forming movable levers of the four-bar linkage, at least one of the levers being accessible for manipulation and rotation to engage and disengage the printed circuit board and housing connectors; and
   a coupler link pivotally coupled to the first and second rotating links and functional as a board guide for the printed circuit board.

3. A primed circuit board connector engagement apparatus comprising:
   a four-bar linkage coupled to an electronics system housing whereby a surface of the housing is configured as a stationary link of the four-bar linkage, the four-bar linkage being configured to accept and enable a printed circuit board to travel in a first direction until a connector on the printed circuit board and a corresponding connector coupled to the housing are aligned, then enabling the printed circuit board to travel essentially orthogonal to the first direction to engage the printed circuit board and housing connectors;
   a base link comprising the housing surface and forming the stationary link of the four-bar linkage that is fixed in position relative to the housing;
   first and second rotating links, each pivotally coupled to the base link and forming movable levers of the four-bar linkage, at least one of the levers being accessible for manipulation and rotation to engage and disengage the printed circuit board and housing connectors;
   a coupler link pivotally coupled to the first and second rotating links and functional as a board guide for the printed circuit board; and
   at least one slot formed in the coupler link and configured to engage with pins and/or rollers on the printed circuit board and arrest movement in the first direction upon alignment of the printed circuit board and housing connectors and convert further movement to the orthogonal direction.

4. The apparatus according to claim 2 wherein:
   the four-bar linkage is configured so that rotation of the accessible lever translates the printed circuit board in the first direction and the orthogonal direction so that pins coupled to the printed circuit board engage with corresponding apertures in the housing, preventing further translation in the first direction, aligning the printed circuit board and housing connectors, and causing additional rotation of the accessible lever to result in orthogonal motion alone to fully engage the connector.

5. The apparatus according to claim 1 further comprising:
   a housing configured to accept a plurality of printed circuit boards in a vertical layout so that vertical printed circuit boards connect to a horizontal midplane or backplane coupled to the housing with printed circuit boards loaded into the housing from the front and/or rear of the housing.

6. The apparatus according to claim 1 wherein:
   the four-bar linkage engages multiple connectors on the printed circuit board to multiple connectors in the housing.

7. The apparatus according to claim 1 further comprising:
   the electronics system housing;
   a midplane coupled to the electronics system housing and having first and second planar sides;
   a plurality of connectors mounted in adjacent rows on the first and second planar sides of the midplane; and
   a plurality of four-bar linkages coupled to planar surfaces parallel to the midplane and configured in adjacent rows that enable a plurality of printed circuit boards to attach to the plurality of connectors.

8. The apparatus according to claim 1 father comprising:
   the electronics system housing with front and rear apertures configured for respective front and rear entry of printed circuit boards;
   a midplane coupled to the electronics system housing and having first and second planar sides;

a plurality of connectors mounted in front and rear columns of adjacent rows on the first and second planar sides of the midplane; and a plurality of four-bar linkages coupled to planar surfaces parallel to the midplane and configured in front and rear columns of adjacent rows that enable a plurality of printed circuit boards to attach to the plurality of connectors.

9. The apparatus according to claim 1 wherein:

the electronic system housing is configured to accept a plurality of printed circuit boards in a vertical layout so that vertical printed circuit boards connect to a horizontal midplane or backplane coupled to the housing with printed circuit boards loaded into the housing from the front and/or rear of the housing.

10. A connector apparatus for using in an electronic system comprising:

a midplane or backplane connector capable of coupling to a first surface of an electronic system housing; and a four-bar linkage coupled to an electronic system housing second surface substantially parallel with and opposing the first surface whereby the second surface is configured as a stationary link of the four-bar linkage, the four-bar linkage being configured to accept and enable a printed circuit board to travel in a first direction until a connector on the printed circuit board and the midplane or backplane connector are aligned, then enabling the printed circuit board to travel essentially orthogonal to the first direction to engage the printed circuit board and midplane or backplane connectors.

11. The apparatus according to claim 10 further comprising:

a printed circuit board configured with a connector configured to engage the midplane or backplane connector.

12. The apparatus according to claim 10 further comprising:

a base link comprising the second surface and forming the stationary link of the four-bar linkage that is fixed in position relative to the electronic system housing;

first and second rotating links, each pivotally coupled to the base link and forming movable levers of the four-bar linkage, at least one of the levers being accessible for manipulation and rotation to engage and disengage the printed circuit board and housing connectors; and a coupler link pivotally coupled to the first and second rotating links and functional as a board guide for the printed circuit board.

13. A connector apparatus for using in an electronic system comprising:

a midplane or backplane connector capable of coupling to a first surface of an electronic system housing;

a four-bar linkage coupled to an electronic system housing second surface substantially parallel with and opposing the first surface whereby the second surface is configured as a stationary link of the four-bar linkage, the four-bar linkage being configured to accept and enable a printed circuit board to travel in a first direction until a connector on the printed circuit board and the midplane or backplane connector are aligned, then enabling the printed circuit board to travel essentially orthogonal to the first direction to engage the printed circuit board and midplane or backplane connectors;

a base link comprising the second surface and forming the stationary link of the four-bar linkage that is fixed in position relative to the electronic system housing;

first and second rotating links, each pivotally coupled to the base link and forming movable levers of the four-bar linkage, at least one of the levers being accessible for manipulation and rotation to engage and disengage the printed circuit board and housing connectors;

a coupler link pivotally coupled to the first and second rotating links and functional as a board guide for the printed circuit board; and at least one slot formed in the coupler link and configured to engage with pins and/or rollers on the printed circuit board arid arrest movement in the first direction upon alignment of the printed circuit board and housing connectors and convert further movement to the orthogonal direction.

14. The apparatus according to claim 12 wherein:

the four-bar linkage is configured so that rotation of the accessible lever translates the printed circuit board in the first direction and the orthogonal direction so that pins coupled to the printed circuit board engage with corresponding apertures in the housing, preventing further translation in the first direction, aligning the printed circuit board and housing connectors, and causing additional rotation of the accessible lever to result in orthogonal motion alone to fully engage the connectors.

15. The apparatus according to claim 10 thither comprising:

an electronic system housing configured to accept a plurality of printed circuit boards in a vertical layout so that vertical printed circuit boards connect to a horizontal midplane or backplane coupled to the housing with printed circuit boards loaded into the housing from the front and/or rear of the housing.

16. The apparatus according to claim 10 wherein:

the four-bar linkage engages multiple connectors on the printed circuit board to multiple connectors in the housing.

17. The apparatus according to claim 10 further comprising:

the electronics system housing;

a midplane coupled to the electronics system housing and having first and second planar sides;

a plurality of midplane connectors mounted in adjacent rows on the first and second planar sides of the midplane; and a plurality of four-bar linkages coupled to planar surfaces parallel to the midplane and configured in adjacent rows that enable a plurality of printed circuit boards to attach to the plurality of connectors.

18. The apparatus according to claim 10 further comprising:

the electronics system housing with front and rear apertures configured for respective front and rear entry of printed circuit boards;

a midplane coupled to the electronics system housing and having first and second planar sides;

a plurality of midplane connectors mounted in front and rear columns of adjacent rows on the first and second planar sides of the midplane; and a plurality of four-bar linkages coupled to planar surfaces parallel to the midplane and configured in front and tear columns of adjacent rows that enable a plurality of printed circuit boards to attach to the plurality of connectors.

19. An electronic system comprising:

a housing;

at least one midplane or backplane connector coupled to a surface of the housing; and at least one four-bar linkage coupled to a surface of the housing configured as a stationary link of the four-bar linkage substantially parallel and opposing ones of the at least one midplane or backplane connector surface, the four-tar linkages being configured to accept and enable a printed circuit board to travel in a first direction until a connector on the printed circuit board and the midplane or backplane connector are aligned, then enable the printed circuit board to travel essentially orthogonal to the first direction to engage the printed circuit board and midplane or backplane connectors.

20. The electronic system according to claim 19 wherein:
the electronic system is selected from among a group consisting of servers, computer systems, computers, storage systems, communication systems, and application processing systems.

21. The electronic system according to claim 19 further comprising:
at least one printed circuit board configured with a connector capable of engagement by the midplane or backplane connector.

22. The electronic system according to claim 19 further comprising:
a base link firmly affixed to the electronic system housing and forming a stationary link of the four-bar linkage;
first and second rotating links, each pivotally coupled to the base link and forming movable levers of the four-bar linkage, at least one of the levers being accessible for manipulation and rotation to engage and disengage the printed circuit board and midplane or backplane connectors; and
a coupler link pivotally coupled to the first and second rotating links and functional as a board guide for the printed circuit board.

23. The electronic system according to claim 22 further comprising:
at least one slot formed in the coupler link and configured to engage with pins and/or rollers on the printed circuit board.

24. The electronic system according to claim 22 wherein:
the four-bar linkage is configured so that rotation of the accessible lever translates the printed circuit board in the first direction and the orthogonal direction so that pins coupled to the printed circuit board engage with corresponding apertures in the housing, preventing further translation in the first direction, aligning the printed circuit board and midplane or backplane connectors, and causing additional rotation of the accessible lever to result in orthogonal motion alone to fully engage the connector.

25. The electronic system according to claim 22 wherein:
the housing is configured to accept a plurality of printed circuit boards in a vertical layout so that vertical printed circuit boards connect to a horizontal midplane or backplane coupled to the housing with printed circuit boards loaded into the housing from the front and/or rear of the housing.

26. The electronic system according to claim 22 wherein:
the four-bar linkage engages multiple connectors on the printed circuit board to multiple connectors in the housing.

27. A printed circuit board connector engagement apparatus comprising:
an electronic system housing configured as a stationary base link of a four-bar linkage;
first and second rotating links, each pivotally coupled to the stationary base link and forming movable levers of the four-bat linkage, at least one of the levers being accessible for manipulation and rotation to engage and disengage the printed circuit board and housing connectors; and
a coupler link pivotally coupled to the first and second rotating links and functional as a board guide for the printed circuit board.

28. A printed circuit board connector engagement apparatus comprising:
an electronic system housing configured as a stationary base link of a four-bar linkage;
first and second rotating links, each pivotally coupled to the stationary base link and forming movable levers of the four-bar linkage, at least one of the levers being accessible for manipulation and rotation to engage and disengage the printed circuit board and housing connectors;
a coupler link pivotally coupled to the first and second rotating links and functional as a board guide for the printed circuit board; and
at least one slot formed in the coupler link and configured to engage with pins and/or rollers on the printed circuit board and arrest movement in the first direction upon alignment of the printed circuit board and housing connectors and convert further movement to the orthogonal direction.

29. A printed circuit board connector engagement apparatus comprising:
an electronic system housing configured as a stationary base link of a four-bar linkage;
first and second rotating links, each pivotally coupled to the stationary base link and forming movable levers of the four-bar linkage, at least one of the levers being accessible for manipulation and rotation to engage and disengage the printed circuit board and housing connectors; and
a coupler link pivotally coupled to the first and second rotating links and functional as a board guide for the printed circuit board, wherein:
the four-bar linkage is configured so that rotation of the accessible lever translates the printed circuit board in the first direction and the orthogonal direction so that pins coupled to the printed circuit board engage with corresponding apertures in the housing, preventing thither translation in the first direction, aligning the printed circuit board and housing connectors, and causing additional rotation of the accessible lever to result in orthogonal motion alone to fully engage the connector.

* * * * *

UNITED STATES PATENT AND TRADEMARK OFFICE
CERTIFICATE OF CORRECTION

PATENT NO. : 7,145,780 B2  Page 1 of 1
APPLICATION NO. : 10/835962
DATED : December 5, 2006
INVENTOR(S) : Christopher G. Malone et al.

It is certified that error appears in the above-identified patent and that said Letters Patent is hereby corrected as shown below:

In column 5, line 66, in Claim 3, delete "primed" and insert -- printed --, therefor.

In column 6, line 62, in Claim 8, delete "father" and insert -- further --, therefor.

In column 8, line 9, in Claim 13, delete "arid" and insert -- and --, therefor,

In column 8, line 24, in Claim 15, delete "thither" and insert -- further --, therefor.

In column 8, line 60, in Claim 18, delete "tear" and insert -- rear --, therefor.

In column 9, line 5, in Claim 19, delete "four-tar" and insert -- four-bar --, therefor.

In column 10, line 8, in Claim 27, delete "four-bat" and insert -- four-bar --, therefor.

In column 10, line 55, in Claim 29, delete "thither" and insert -- further --, therefor.

Signed and Sealed this

Twenty-second Day of December, 2009

David J. Kappos
*Director of the United States Patent and Trademark Office*